US012474129B2

(12) United States Patent
Lee et al.

(10) Patent No.: US 12,474,129 B2
(45) Date of Patent: Nov. 18, 2025

(54) HEAT EXCHANGER ASSEMBLY AND WATER HEATER COMPRISING SAME

(71) Applicant: KYUNGDONG NAVIEN CO., LTD., Gyeonggi-do (KR)

(72) Inventors: Seung Je Lee, Seoul (KR); Dae Woong Park, Seoul (KR); Sung Soo Yang, Seoul (KR)

( * ) Notice: Subject to any disclaimer, the term of this patent is extended or adjusted under 35 U.S.C. 154(b) by 180 days.

(21) Appl. No.: 18/043,536

(22) PCT Filed: Jul. 30, 2021

(86) PCT No.: PCT/KR2021/010012
§ 371 (c)(1),
(2) Date: Feb. 28, 2023

(87) PCT Pub. No.: WO2022/045607
PCT Pub. Date: Mar. 3, 2022

(65) Prior Publication Data
US 2023/0280108 A1 Sep. 7, 2023

(30) Foreign Application Priority Data

Aug. 31, 2020 (KR) .................. 10-2020-0110418
Jun. 25, 2021 (KR) .................. 10-2021-0083490

(51) Int. Cl.
*F28F 3/06* (2006.01)
*F24H 1/14* (2022.01)
(Continued)

(52) U.S. Cl.
CPC ............. *F28F 3/06* (2013.01); *F24H 1/14* (2013.01); *F24H 9/1809* (2013.01); *F28F 13/06* (2013.01)

(58) Field of Classification Search
CPC . F28F 3/025; F28F 3/027; F28F 13/06; H01L 23/473; F24H 9/1809; F24H 1/14
See application file for complete search history.

(56) References Cited

U.S. PATENT DOCUMENTS 5,193,611 A * 3/1993 Hesselgreaves .......... F28F 3/02
29/890.039
5,423,376 A * 6/1995 Julien .................. H01L 23/473
257/E23.098
(Continued)

FOREIGN PATENT DOCUMENTS

JP 2005-282961 A 10/2005
JP 2007-040687 A 2/2007
(Continued)

OTHER PUBLICATIONS

Final Office Action issued on Jun. 26, 2023 for the corresponding Korean Patent Application Serial No. 10-2021-0083490.

*Primary Examiner* — Tho V Duong

(57) ABSTRACT

The present invention relates to a heat exchanger assembly and a water heater comprising same, wherein the heat exchanger assembly comprises a heat exchanger unit provided with an inlet for introducing a fluid and an outlet for discharging the fluid, and the heat exchanger unit may comprise: a first plate; a second plate disposed on one surface side of the first plate to define, together with the first plate, an internal space in which the fluid introduced through the inlet moves toward the outlet; a heat generation member coupled to at least one of the first plate and the second plate and provided to provide heat into the internal space; and a guide part disposed in the internal space and provided to guide the fluid introduced through the inlet toward one plate, to which the heat generation member is coupled, of the first plate and the second plate.

7 Claims, 17 Drawing Sheets

(51) Int. Cl.
*F24H 9/1809* (2022.01)
*F28F 13/06* (2006.01)

(56) References Cited

U.S. PATENT DOCUMENTS

| | | | | |
|---|---|---|---|---|
| 6,014,312 | A | * | 1/2000 | Schulz-Harder ........ F28F 3/086 |
| | | | | 257/E23.098 |
| 7,011,142 | B2 | * | 3/2006 | Davies ...................... F28F 3/12 |
| | | | | 174/15.1 |
| 7,537,047 | B2 | * | 5/2009 | Lai ...................... H01L 23/4735 |
| | | | | 257/714 |
| 8,120,914 | B2 | * | 2/2012 | Kajiura ................. H01L 23/473 |
| | | | | 361/689 |
| 10,197,343 | B2 | | 2/2019 | Negi |
| 11,109,511 | B2 | * | 8/2021 | Oguri .................. H01L 21/4871 |
| 2006/0108100 | A1 | * | 5/2006 | Goldman ................ F28F 3/048 |
| | | | | 165/170 |
| 2007/0246204 | A1 | * | 10/2007 | Lai ....................... H01L 23/473 |
| | | | | 257/E23.098 |
| 2016/0370128 | A1 | * | 12/2016 | Agata .................... B01D 3/008 |
| 2017/0307309 | A1 | | 10/2017 | Negi |

FOREIGN PATENT DOCUMENTS

| | | |
|---|---|---|
| JP | 2017-194226 A | 10/2017 |
| JP | 2019-211112 A | 12/2019 |
| KR | 10-2004-0086876 A | 10/2004 |
| KR | 10-2015-0034919 A | 9/2015 |
| KR | 10-2020-0004511 A | 1/2020 |
| KR | 10-2020-0065779 A | 9/2020 |

\* cited by examiner

HEAT EXCHANGER ASSEMBLY AND WATER HEATER COMPRISING SAME

TECHNICAL FIELD

The present invention relates to a heat exchanger assembly and a water heater including the same.

BACKGROUND ART

Heat exchangers for generating hot water are used in water heating devices such as boilers and water heaters. Among them, in the case of a general plate-type planar heating element heat exchanger, a planar heating element adheres to an outside of a body made of a metal to generate heat, and a flow path is formed inside the body.

However, to increase the heat exchanger efficiency of the heat exchanger, a flow inside the heat exchanger should be turbulent. However, in the case of a general plate-type heat exchanger, an internal flow forms a laminar flow, and thus heat exchange efficiency is low.

Further, in the case of such a planar heating element heat exchanger, since pressure resistance of the body is insufficient, the body may be deformed, and accordingly, the planar heating element adhering to the outside of the body may be peeled off.

Further, in the case of a plate-type heat exchanger according to the related art, since a brazing area should be secured for pressure resistance, a large area unrelated to the flow should be secured, and thus it is difficult to achieve miniaturization of the heat exchanger.

DISCLOSURE

Technical Problem

The present invention is directed to providing a heat exchanger assembly that has high heat exchange efficiency, secures pressure resistance, and is miniaturized, and a water heater including the same.

Technical Solution

In an example, a heat exchanger assembly includes a heat exchanger unit having an inlet through which a fluid is introduced and an outlet through which the fluid is discharged, wherein the heat exchanger unit includes a first plate, a second plate disposed on one surface of the first plate and defining, together with the first plate, an internal space through which the fluid introduced through the inlet flows to the outlet, a heating member that is coupled to at least one of the first plate and the second plate and provides heat to the internal space, and a guide part that is disposed in the internal space and guides the fluid introduced through the inlet toward a plate, to which the heating member is coupled, among the first plate and the second plate.

In another example, the guide part may include a guide part body that is disposed in the internal space and partitions the internal space into a first space adjacent to the first plate and a second space adjacent to the second plate, a hole formed in the guide part body, through which the fluid passes, and a protrusion member that protrudes toward the first plate or the second plate from a vicinity of the hole of the guide part body and guides the fluid introduced through the inlet to the hole such that the fluid moves from the first space to the second space or moves from the second space to the first space.

In still another example, the hole may be provided as a plurality of holes, and the protrusion member may include a first protrusion member protruding toward the first plate from a vicinity of any one hole among the plurality of holes of the guide part body so that the fluid in the first space moves to the second space through the any one hole, and a second protrusion member protruding toward the second plate from a vicinity of another hole among the plurality of holes of the guide part body so that the fluid in the second space moves to the first space through the another hole.

In yet another example, the first protrusion member may be provided in contact with the first plate, and the second protrusion member may be provided in contact with the second plate.

In yet another example, the first protrusion member and the second protrusion member may be alternately arranged in a traveling direction that is a direction from the inlet to the outlet and provided to guide the fluid introduced through the inlet such that the fluid flows to the outlet while being alternately introduced into the first space and the second space.

In yet another example, the heating member may be a planar heating element, and the heating member may include a first heating member coupled to the first plate, and a second heating member coupled to the second plate.

In yet another example, the guide part may include a plate-shaped first guide portion disposed in surface contact with a surface, facing the second plate, among surfaces of the first plate and including a first hole that guides the fluid introduced through the inlet toward the second plate, and a plate-shaped second guide portion disposed in surface contact with a surface, facing the first plate, among surfaces of the second plate and including a second hole that guides the fluid introduced from the first hole toward the first plate.

In yet another example, the guide part may include a plate-shaped first guide portion including a plurality of first holes, and a plate-shaped second guide portion including a plurality of second holes, the first plate, the first guide portion, the second guide portion, and the second plate may be sequentially stacked in surface contact in a predetermined stacking direction, each of the plurality of first holes may include, with respect to the stacking direction, a $(1\text{-}1)^{th}$ overlapping area communicatively overlapping any one of the plurality of second holes, a first non-overlapping area communicating with the $(1\text{-}1)^{th}$ overlapping area and not overlapping the plurality of second holes, and a $(1\text{-}2)^{th}$ overlapping area communicating with the first non-overlapping area and communicatively overlapping another one of the plurality of second holes, and each of the plurality of second holes may include a $(2\text{-}1)^{th}$ overlapping area communicatively overlapping any one of the plurality of first holes, a second non-overlapping area communicating with the $(2\text{-}1)^{th}$ overlapping area and not overlapping the plurality of first holes, and a $(2\text{-}2)^{th}$ overlapping area communicating with the second non-overlapping area and communicatively overlapping another one of the plurality of first holes.

In yet another example, the any one, overlapping the $(1\text{-}1)^{th}$ overlapping area, among the plurality of second holes may be disposed closer to any one of the inlet and the outlet than the another one, overlapping the $(1\text{-}2)^{th}$ overlapping area, among the plurality of second holes, and the any one, overlapping the $(2\text{-}1)^{th}$ overlapping area, among the plurality of first holes may be disposed closer to the other one of the inlet and the outlet than the another one, overlapping the $(2\text{-}2)^{th}$ overlapping area, among the plurality of first holes.

In yet another example, the guide part may include a plate-shaped first guide portion disposed in surface contact with a surface, facing the second plate, among surfaces of the first plate and including a plurality of holes that guides the fluid toward the second plate, and a plate-shaped second guide portion disposed in surface contact with a surface, facing the first plate, among surfaces of the second plate and including a plurality of second holes that guides the fluid toward the first plate, the first holes may be formed in one of a V shape open toward the outlet and a V shape open toward the inlet and arranged consecutively in a traveling direction that is a direction from the inlet to the outlet, and the second holes may overlap and communicate with at least two of the first holes, may be formed in the other one of the V shape open toward the outlet and the V shape open toward the inlet, and may be consecutively arranged in the traveling direction.

In yet another example, the guide part may include a plate-shaped first guide portion disposed in surface contact with a surface, facing the second plate, among surfaces of the first plate and including a first hole that guides the fluid toward the second plate, a first inlet communicating with the inlet, and a first outlet communicating with the outlet, and a plate-shaped second guide portion disposed in surface contact with a surface, facing the first plate, among surfaces of the second plate and including a second hole that guides the fluid toward the first plate, a second inlet communicating with the first inlet, and a second outlet communicating with the first outlet.

In yet another example, when a traveling direction is a direction from the inlet to the outlet, the first inlet may have a shape extending in a direction opposite to the traveling direction, and the first outlet may have a shape extending in the traveling direction.

In yet another example, the second inlet may have a shape extending in the direction opposite to the traveling direction, the second outlet may have a shape extending in the traveling direction, the first inlet may have a shape symmetrical to the second outlet, and the first outlet may have a shape symmetrical to the second inlet.

In yet another example, the guide part may include a first guide portion including a plate-shaped first guide portion body disposed in surface contact with a surface, facing the second plate, among surfaces of the first plate and a first hole that is formed in the first guide portion body and guides the fluid toward the second plate, and a second guide portion including a plate-shaped second guide portion body disposed in surface contact with a surface, facing the first plate, among surfaces of the second plate and a second hole that is formed in the second guide portion body and guides the fluid toward the first plate, and at least a portion of a surface on which the first guide portion body and the second guide portion body are in contact with each other may be joined by brazing.

In yet another example, when a direction from the inlet to the outlet is a traveling direction, the first guide portion body may include a first central area that extends in the traveling direction and partitions the first hole, and the second guide portion body may include a second central area that extends in the traveling direction, partitions the second hole, is positioned to correspond to the first central area, and is in surface contact with the first central area.

In yet another example, the heating member may include a first heating member coupled to the first plate, and a second heating member coupled to the second plate, the first heating member, the first plate, the first guide portion, the second guide portion, the second plate, and the second heating member may be sequentially stacked in surface contact in a predetermined stacking direction, and when viewed in the stacking direction, the first heating member and the second heating member may be arranged such that there is no area overlapping the first central area.

In yet another example, an end portion of the first plate may protrude toward the second plate, an end portion of the second plate may protrude toward the first plate and is disposed inside or outside the end portion of the first plate, and a protrusion length of an end portion of a plate, disposed on an inner side, among the first plate and the second plate may be formed shorter than a length between the first plate and the second plate.

In yet another example, the first plate may include a first protrusion member protruding toward the second plate, the second plate may include a second protrusion member protruding toward the first plate and formed at a position corresponding to the first protrusion member, and the guide part may include fixing holes formed to correspond to positions of the first protrusion member and the second protrusion member so that the first protrusion member and the second protrusion member are inserted thereinto.

In yet another example, an end portion of the first plate may extend along a circumference of the first plate and protrude toward the second plate.

In an example, a water heater includes a direct water pipe through which direct water is supplied, a heat exchanger assembly connected to the direct water pipe and configured to heat the supplied direct water through heat exchange so as to generate hot water, and a hot water pipe which is connected to the heat exchanger assembly and through which the generated hot water is introduced, wherein the heat exchanger assembly includes a heat exchanger unit having an inlet communicating with the direct water pipe and an outlet communicating with the hot water pipe, and the heat exchanger unit includes a first plate and a second plate defining an internal space through which a fluid introduced through the inlet flows toward the outlet, a pair of heating members that are coupled to the first plate and the second plate and electrically heated to provide heat to the internal space, and a guide part disposed between the first plate and the second plate and configured to guide the fluid introduced through the inlet such that the fluid moves forward while alternately coming into contact with the first plate and the second plate in a process of flowing toward the outlet.

Advantageous Effects

According to the present invention, a flow path capable of making turbulent flow is formed inside a heat exchanger unit, and thus heat exchange efficiency may increase.

Further, according to the present invention, a guide part inside the heat exchanger unit may support a first plate and a second plate, and thus pressure resistance may be secured.

Further, according to the present invention, an overlapping portion between the first plate and the second plate is brazed, and thus an additional area for joining is not required, and the heat exchanger unit may be miniaturized.

MODE FOR INVENTION

Figure 1:
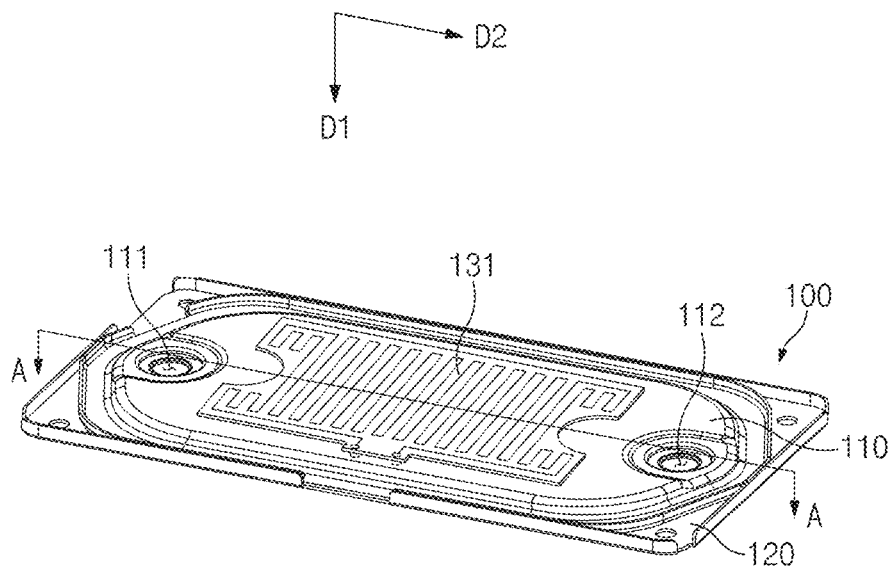
FIG. 1 is a view illustrating a heat exchanger unit of a heat exchanger assembly according to a first embodiment of the present invention.

This application claims the benefits of priorities to Korean Patent Application No. 10-2020-0110418, filed in the Korean Intellectual Property Office on Aug. 31, 2020 and Korean Patent Application No. 10-2021-0083490, filed in the Korean Intellectual Property Office on Jun. 25, 2021, the entire contents of which are incorporated herein by reference.

Hereinafter, some embodiments of the present invention will be described in detail with reference to the exemplary drawings. When components in the drawings are designated by reference numerals, the same components have the same reference numerals as far as possible even though the components are illustrated in different drawings. Further, in description of the embodiments of the present invention, when it is determined that a detailed description of a related well-known configuration or function disturbs understanding of the embodiments of the present invention, the detailed description will be omitted.

Embodiment 1

Figure 2:
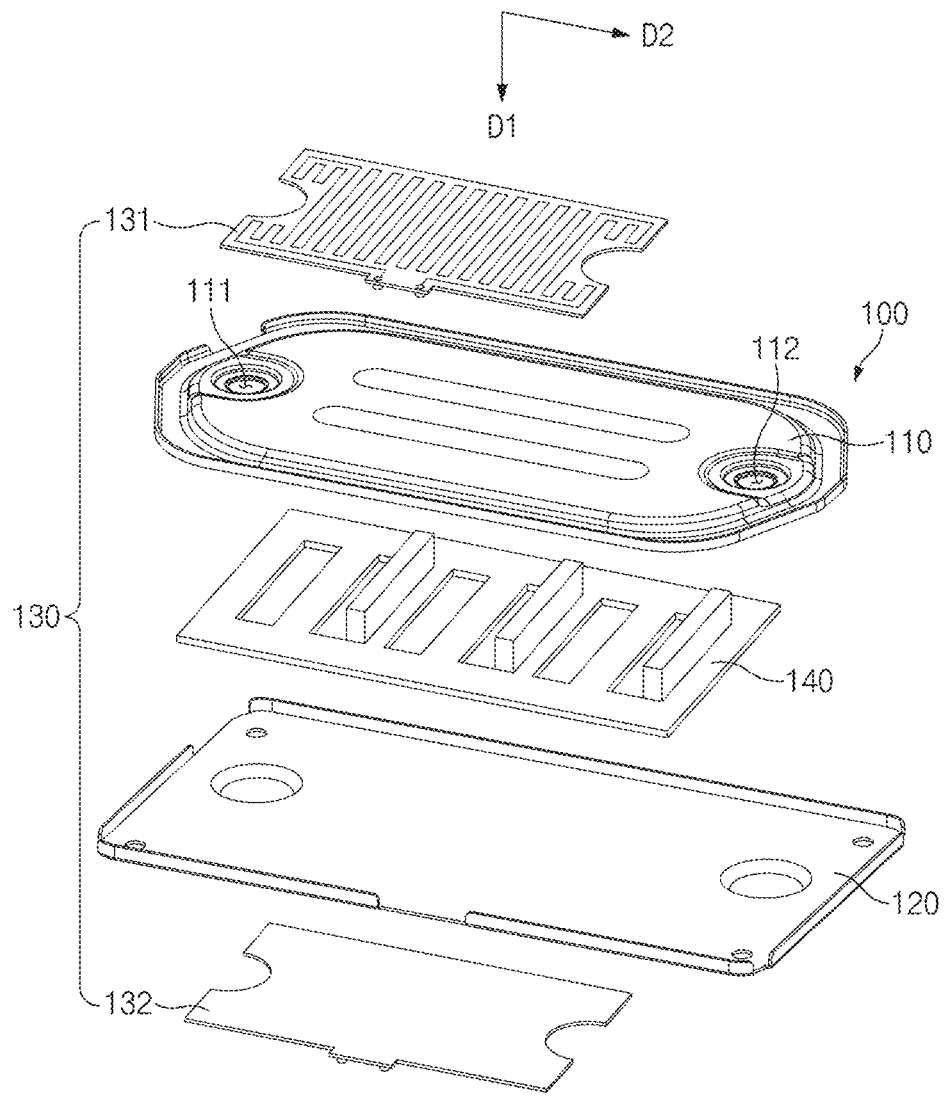
FIG. 2 is an exploded perspective view of the heat exchanger unit of FIG. 1.
Figure 3:
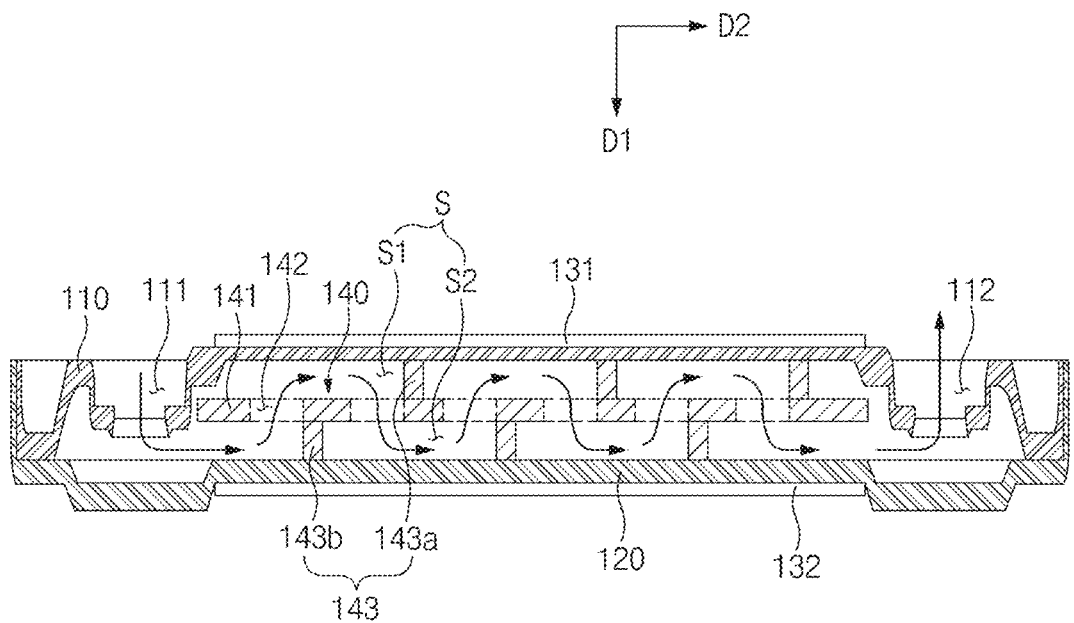
FIG. 3 is a cross-sectional view along line A-A of FIG. 1.

A heat exchanger assembly according to a first embodiment relates to a heat exchanger having improved heat exchange efficiency. The heat exchanger assembly according to the first embodiment of the present invention includes a heat exchanger unit 100. FIG. 1 is a view illustrating a heat exchanger unit of a heat exchanger assembly according to a first embodiment of the present invention. FIG. 2 is an exploded perspective view of the heat exchanger unit of FIG. 1. FIG. 3 is a cross-sectional view along line A-A of FIG. 1.

The heat exchanger unit 100 may include an inlet 111 for introducing a fluid and an outlet 112 for discharging the fluid.

Heat Exchanger Unit 100

Figure 4:
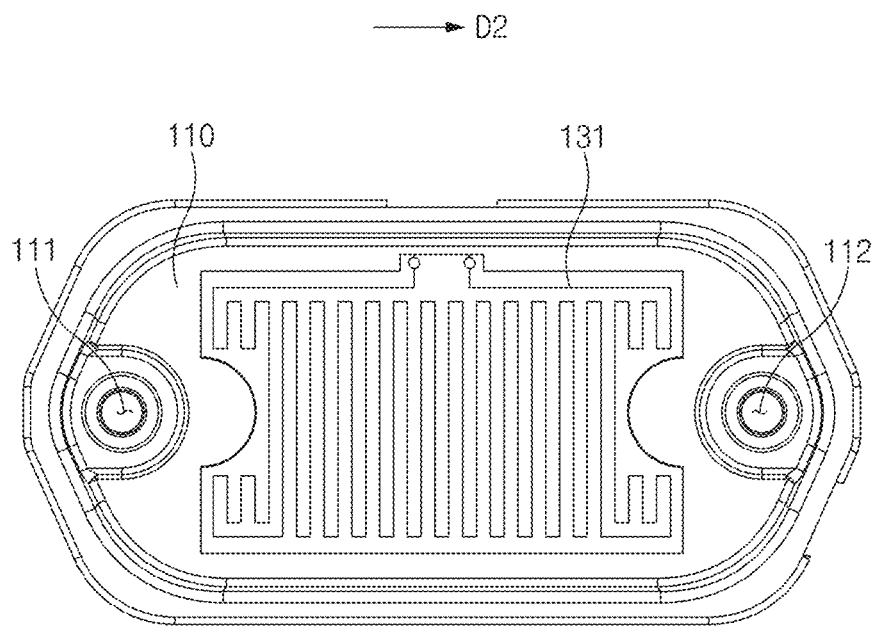
FIG. 4 is a view illustrating a first plate of the heat exchanger unit of FIG. 1.
Figure 5:
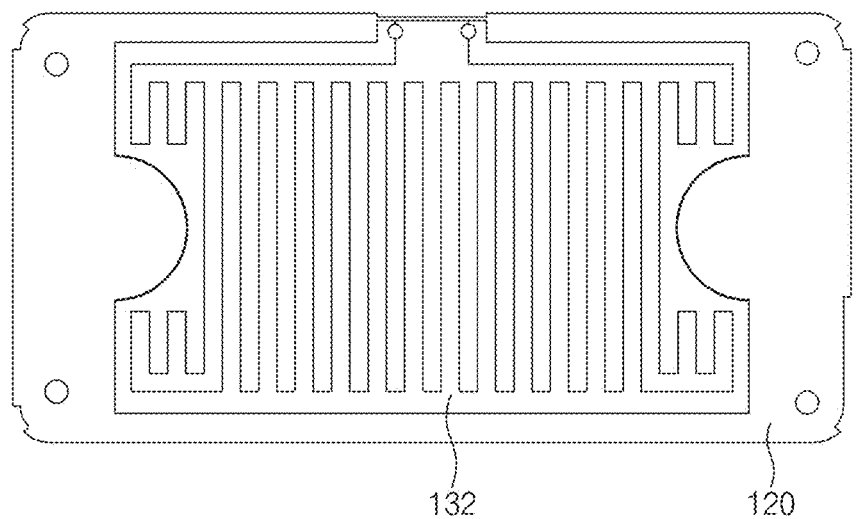
FIG. 5 is a view illustrating a second plate of the heat exchanger unit of FIG. 1.

As illustrated in FIG. 3, the heat exchanger unit 100 may include a first plate 110, a second plate 120, and a heating member 130. FIG. 4 is a view illustrating a first plate of the heat exchanger unit of FIG. 1. FIG. 5 is a view illustrating a second plate of the heat exchanger unit of FIG. 1.

As illustrated in FIG. 4, the first plate 110 may include the inlet 111 and the outlet 112. The second plate 120 may be disposed on one surface of the first plate 110. As an example, the second plate 120 may be disposed to have a surface facing the first plate 110. The second plate 120 together with the first plate 110 may define an internal space "S". As illustrated in FIG. 3, the internal space "S" may be a space in which the fluid introduced through the inlet 111 flows toward the outlet 112. The defining of a space may mean forming a closed space or a partially open space between elements based on a certain element.

Edges of the first plate 110 and the second plate 120 may be coupled to each other so that there is no space communicating with the outside except for the inlet 111 and the outlet 112.

The heating member 130 may provide heat to the internal space "S". The heating member 130 may be a planar heating element. The heating member 130 may be coupled to at least one of the first plate 110 and the second plate 120. The heating member 130 may include at least one of a first heating member 131 coupled to the first plate 110 and a second heating member 132 coupled to the second plate 120.

As illustrated in FIG. 3, the heat exchanger unit 100 may include a guide part 140. The guide part 140 may guide the fluid introduced through the inlet 111 toward a plate, which is coupled to the heating member 130, among the first plate 110 and the second plate 120. The guide part 140 may be disposed in the internal space "S". For example, when the heating member 130 is attached to the second plate 120, the guide part 140 may guide the fluid such that the fluid flows toward the second plate 120. As another example, when both the first plate 110 and the second plate 120 are attached to the heating member 130, the guide part 140 may guide the fluid such that the fluid flows toward the first plate 110 and the second plate 120.

For example, a heat exchanger assembly including a heat exchanger unit not including the guide part may be considered. In this case, the flow of the fluid introduced into the heat exchanger unit forms a laminar flow, and since the laminar flow has lower fluidity than a turbulent flow, heat exchange efficiency is low.

In the heat exchanger assembly according to an embodiment of the present invention, since the turbulent flow may be formed through the guide part 140 included in the internal space "S" of the heat exchanger unit 100, heat exchange efficiency may increase. Further, since the guide part 140 included in the internal space "S" of the heat exchanger unit 100 guides the fluid toward the plate, to which the heating member 130 is coupled, among the plates, heat exchange efficiency may increase.

Guide Part 140

Figure 6:
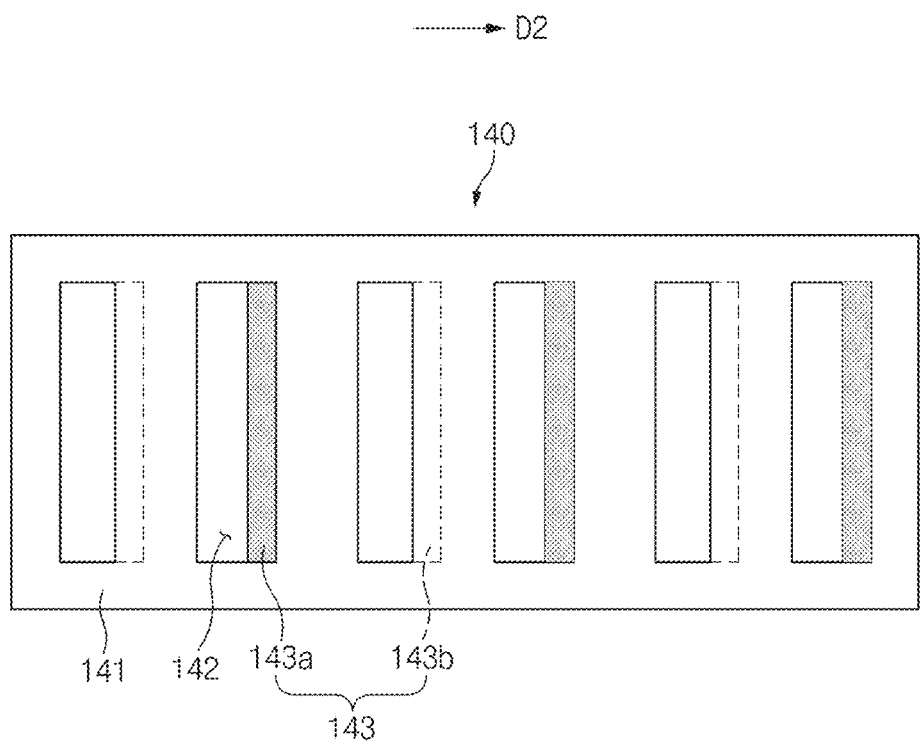
FIG. 6 is a conceptual diagram illustrating a guide part of the heat exchanger unit of FIG. 1.

FIG. 6 is a conceptual diagram illustrating a guide part of the heat exchanger unit of FIG. 1. As illustrated in FIG. 6, the guide part 140 may include a guide part body 141, a hole 142, and a protrusion member 143. As illustrated in FIG. 3, the guide part body 141 may be disposed in the internal space "S". The guide part body 141 may partition the internal space "S" into a first space S1 and a second space S2. The first space S1 may be a predetermined space of the internal space "S", which is adjacent to the first plate 110. The second space S2 may be a predetermined space of the internal space "S", which is adjacent to the second plate 120.

The hole 142 may be formed in the guide part body 141. A fluid may pass through the hole 142. The hole 142 may have a circular shape or a rectangular shape, a slot shape, or the like, and the shape of the hole 142 is not limited thereto as long as the fluid may pass through the hole 142. Through the hole 142, the fluid positioned in the first space S1 may move to the second space S2, and the fluid positioned in the first space S1 may move to the second space S2. The hole 142 may be provided as a plurality of holes 142.

The protrusion member 143 may protrude toward the first plate 110 or the second plate 120 from the vicinity of the hole 142 of the guide part body 141. The protrusion member 143 may guide the fluid to the hole 142. The fluid introduced through the inlet 111 may move from the first space S1 to the second space S2 through the protrusion member 143. Further, the fluid introduced through the inlet 111 may move from the second space S2 to the first space S1 through the protrusion member 143.

Protrusion Member 143

As illustrated in FIG. 3, the protrusion member 143 may include a first protrusion member 143a and a second protrusion member 143b. The first protrusion member 143a may protrude toward the first plate 110 from the vicinity of one hole 142 among the plurality of holes 142 of the guide part body 141. The first protrusion member 143a may move the fluid in the first space S1 to the second space S2 through any one of the plurality of holes 142. The first protrusion member 143a may be provided in contact with the first plate 110.

The second protrusion member 143b may protrude toward the second plate 120 from the vicinity of another hole 142 among the plurality of holes 142 of the guide part body 141. The second protrusion member 143b may move the fluid in the second space S2 to the first space S1 through the another one of the plurality of holes 142. The second protrusion member 143b may be provided in contact with the second plate 120.

As the first protrusion member 143a and the second protrusion member 143b are in contact with the first plate 110 and the second plate 120, the first protrusion member 143a supports the first plate 110, and the second protrusion member 143b supports the second plate 120, and thus pressure resistance of the heat exchanger unit 100 may be secured.

As illustrated in FIG. 3, the first protrusion member 143a and the second protrusion member 143b may be alternately arranged in a traveling direction D2 that is a direction from the inlet 111 to the outlet 112. For example, when viewed in the traveling direction D2 from the inlet 111 to the outlet 112, the second protrusion member 143b may be disposed next to the first protrusion member 143a, the first protrusion member 143a may be disposed next thereto, and the second protrusion member 143b may be disposed next thereto. The first protrusion member 143a may be formed as a plurality of first protrusion members 143a, and the second protrusion member 143b may be formed as a plurality of second protrusion members 143b. The first protrusion member 143a and the second protrusion member 143b may be provided to guide the fluid such that the fluid introduced through the inlet 111 flows to the outlet 112 while being alternately introduced into the first space S1 and the second space S2.

Embodiment 2

Figure 7:
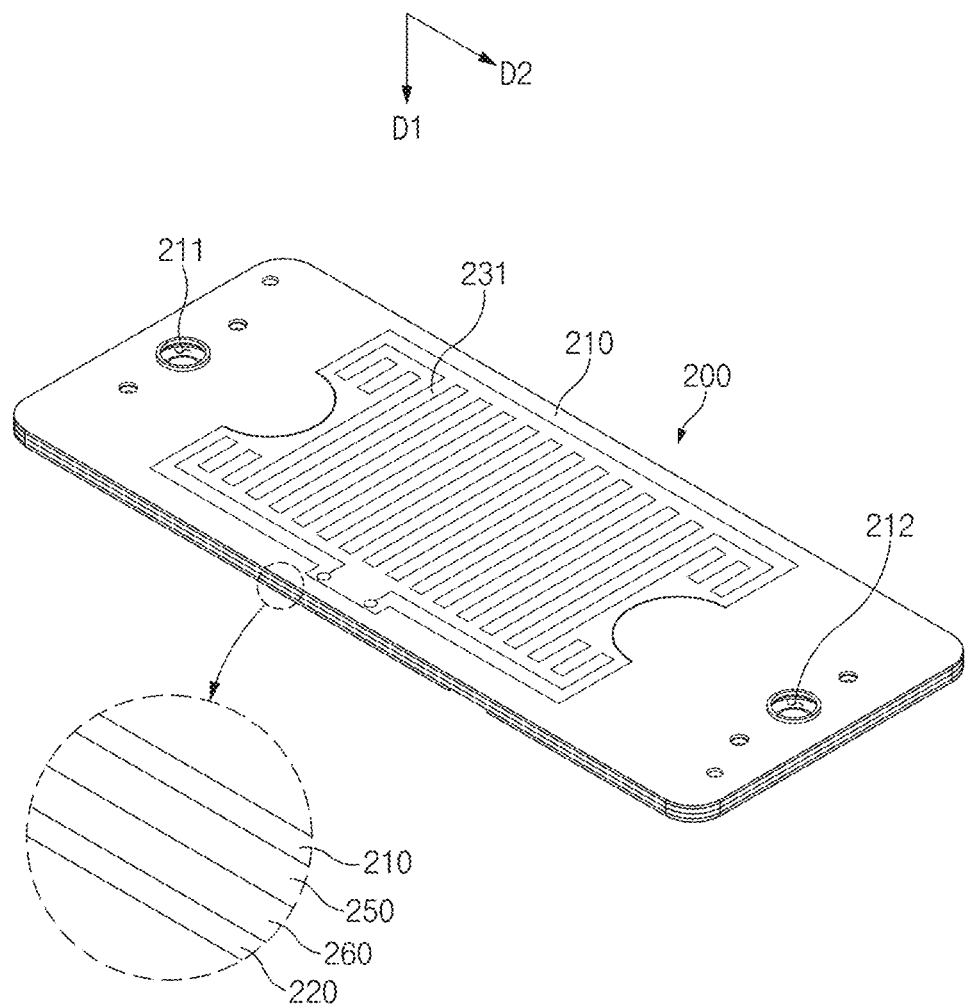
FIG. 7 is a view illustrating a heat exchanger unit of a heat exchanger assembly according to a second embodiment of the present invention.
Figure 8:
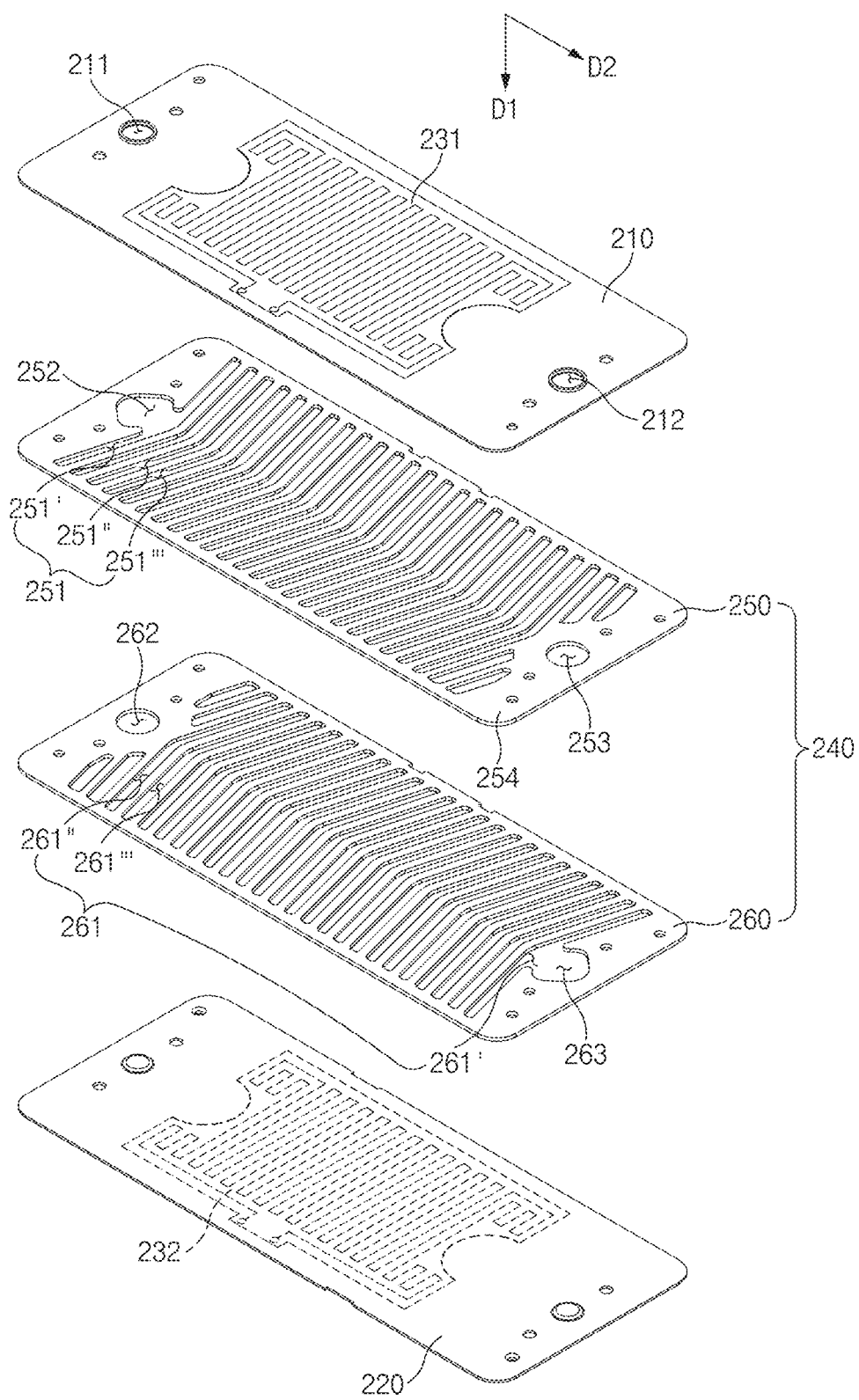
FIG. 8 is an exploded perspective view of the heat exchanger unit of FIG. 7.
Figure 9:
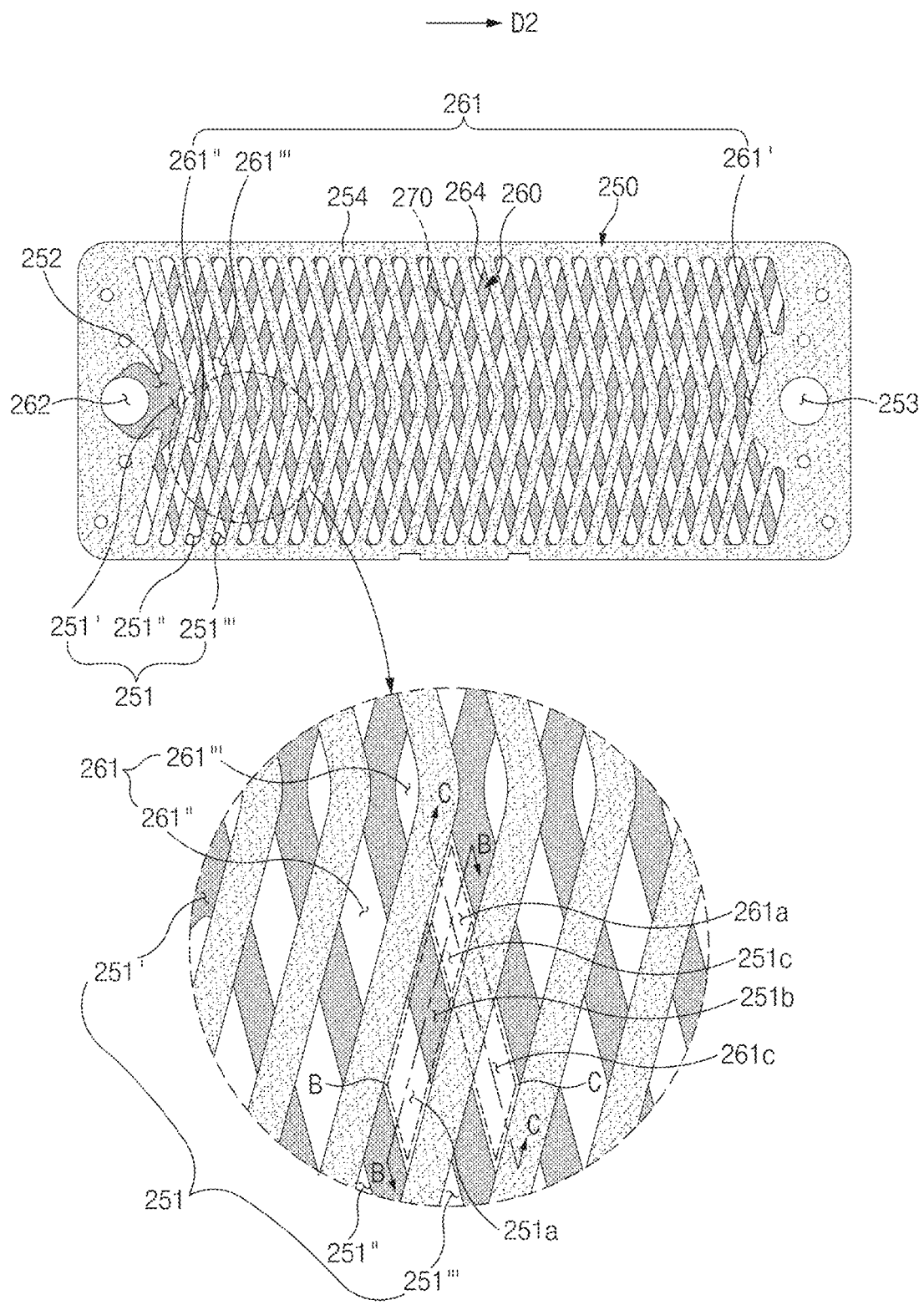
FIG. 9 is a view illustrating a state in which the first guide part and a second guide part in the heat exchanger unit of FIG. 7 are coupled when viewed along a stacking direction.

FIG. 7 is a view illustrating a heat exchanger unit of a heat exchanger assembly according to a second embodiment of the present invention. FIG. 8 is an exploded perspective view of the heat exchanger unit of FIG. 7. FIG. 9 is a view illustrating a state in which the first guide part and a second guide part in the heat exchanger unit of FIG. 7 are coupled when viewed along a stacking direction.

Hereinafter, the heat exchanger assembly according to the second embodiment of the present invention will be described with reference to FIGS. 7 to 9. The heat exchanger assembly according to the second embodiment differs from the heat exchanger assembly according to the first embodiment in terms of the structure of the guide part 240. The same or equivalent components as those of the heat exchanger assembly according to the first embodiment are designated by the same or equivalent reference numerals or are omitted, and a detailed description thereof will be omitted.

Basic Configuration of Heat Exchanger Assembly According to Second Embodiment

As illustrated in FIGS. 7 and 8, the guide part 240 of a heat exchanger unit 200 of the heat exchanger assembly according to the second embodiment may include a first guide portion 250 and a second guide portion 260. The first guide portion 250 and the second guide portion 260 may have a plate shape.

The first guide portion 250 may be disposed in surface contact with a surface, facing a second plate 220, among surfaces of a first plate 210. For example, the first guide portion 250 may be disposed between the first plate 210 and the second plate 220.

The first guide portion 250 may include a first hole 251, a first inlet 252, and a first outlet 253. The first hole 251 may guide the fluid introduced through an inlet 211 toward the second plate 220. A second heating member 232 may be coupled to the second plate 220. The first inlet 252 may communicate with the inlet 211 (see FIG. 8). The first outlet 253 may communicate with an outlet 212 (see FIG. 8).

The second guide portion 260 may be disposed in surface contact with a surface, facing the first plate 210, among surfaces of the second plate 220. For example, the second guide portion 260 may be disposed between the first guide portion 250 and the second plate 220.

The second guide portion 260 may include a second hole 261. The second hole 261 may guide the fluid introduced through the first hole 251 toward the first plate 210. A first heating member 231 may be coupled to the first plate 210.

The second guide portion 260 may further include a second inlet 262 and a second output 263. The second inlet 262 may communicate with the first inlet 252. The second outlet 263 may communicate with the first outlet 253.

The first plate 210, the first guide portion 250, the second guide portion 260, and the second plate 220 may be sequentially stacked in surface contact in a predetermined stacking direction D1.

First Holes 251 and Second Holes 261

The first hole 251 may be provided as a plurality of first holes 251, and the second hole 261 may be provided as a plurality of second holes 261. Hereinafter, the plurality of first holes are named the first holes 251, and the plurality of second holes are named the second holes 261. A first hole 251', closest to the inlet 211, among the first holes 251 may communicate with the first inlet 252. Alternatively, a second hole, closest to the inlet, among the second holes may communicate with the second inlet. As an example, FIG. 8 illustrates a state in which the first hole 251', closest to the inlet 211, among the first holes 251 communicates with the first inlet 252.

A first hole, closest to the outlet, among the first holes may communicate with the first outlet. Alternatively, a second hole 261', closest to the outlet 212, among the second holes 261 may communicate with the second outlet 263. As an example, FIG. 8 illustrates a state in which the second hole 261', closest to the outlet 212, among the second holes 261 communicates with the second outlet 263.

Overlapping Area and Non-overlapping Area

Figure 10:
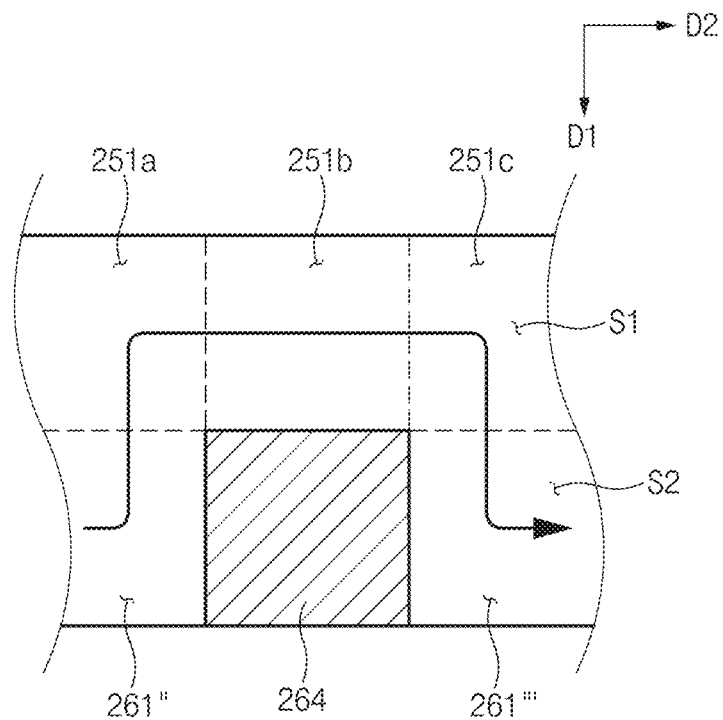
FIG. 10 is a conceptual cross-sectional view illustrating a cross section of area B of FIG. 9 along line B-B.
Figure 11:
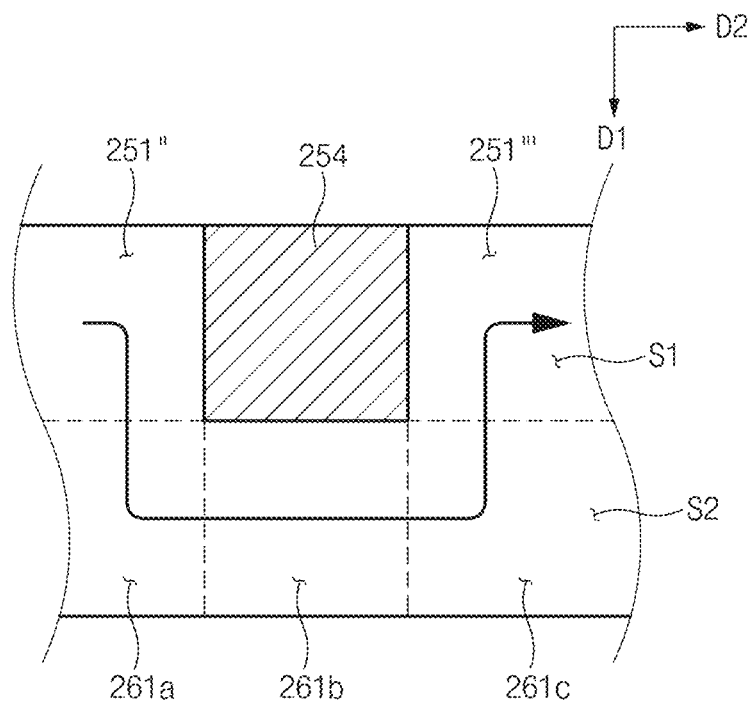
FIG. 11 is a conceptual cross-sectional view illustrating a cross section of area C of FIG. 9 along line C-C.

FIG. 10 is a conceptual cross-sectional view illustrating a cross section of area B of FIG. 9 along line B-B. FIG. 11 is a conceptual cross-sectional view illustrating a cross section of area C of FIG. 9 along line C-C. Hereinafter, an overlapping area and a non-overlapping area will be described with reference to FIGS. 10 and 11.

As illustrated in FIG. 10, each of the plurality of first holes 251 may include a $(1-1)^{th}$ overlapping area 251a, a first non-overlapping area 251b, and a $(1-2)^{th}$ overlapping area 251c. The $(1-1)^{th}$ overlapping area 251a may mean an area communicatively overlapping one second hole 261" among the plurality of second holes 261 with respect to the stacking direction D1. The communicatively overlapping area may mean an overlapping area when viewed in the stacking direction D1. Through the overlapping area, the fluid may move from the first space S1 to the second space S2 or from the second space S2 to the first space S1.

The first non-overlapping area 251b may mean an area that communicates with the $(1-1)^{th}$ overlapping area 251a and does not overlap the plurality of second holes 261. The $(1-2)^{th}$ overlapping area 251c may mean an area that communicates with the first non-overlapping area 251b and communicatively overlaps another second hole 261''' among the plurality of second holes 261. For example, the $(1-1)^{th}$ overlapping area 251a, the first non-overlapping area 251b, and the $(1-2)^{th}$ overlapping area 251c may communicate with each other. In more detail, the fluid introduced from the second space S2 to the first space S1 through the $(1-1)^{th}$ overlapping area 251a may flow to the $(1-2)^{th}$ overlapping area 251c through the first non-overlapping area 251b and may be discharged from the first space S1 to the second space S2 through the $(1-2)^{th}$ overlapping area 251c.

As illustrated in FIG. 10, each of the plurality of second holes 261 may include a $(2-1)^{th}$ overlapping area 261a, a second non-overlapping area 261b, and a $(2-2)^{th}$ overlapping area 261c. The $(2-1)^{th}$ overlapping area 261a may mean an area communicatively overlapping one first hole 251" among the plurality of first holes 251. Any one of the $(2-1)^{th}$ overlapping area may communicate with any one $(1-1)^{th}$ overlapping area or any one $(1-2)^{th}$ overlapping area.

The second non-overlapping area 261b may mean an area that communicates with the $(2-1)^{th}$ overlapping area 261a and does not overlap the plurality of first holes 251. The $(2-2)^{th}$ overlapping area 261c may communicate with the second non-overlapping area 261b and communicatively overlap another first hole 251''' among the plurality of first holes 251. Any one of the $(2-2)^{th}$ overlapping area 261c may communicate with another $(1-1)^{th}$ overlapping area or another $(1-2)^{th}$ overlapping 5 area.

Flow through Overlapping Area and Non-Overlapping Area

Hereafter, flow of the fluid through the overlapping area and the non-overlapping area will be described in detail with reference to FIGS. 10 and 11. The flow of the fluid through the overlapping area and the non-overlapping area may be understood as flow of the fluid moving from the inlet 211 to the outlet 212 while repeatedly moving from the first space S1 to the second space S2 and moving from the second space S2 to the first space S1 as a whole.

For example, as illustrated in FIG. 10, the fluid introduced from the second space S2 into the first space S1 through the $(1-1)^{th}$ overlapping area 251a may flow to the $(1-2)^{th}$ overlapping area 251c through the first non-overlapping area 251b and may be discharged from the $(1-2)^{th}$ overlapping area 251c to the $(2-1)^{th}$ overlapping area 261a. This may be understood that the fluid moves from the first space S1 to the second space S2. As illustrated in FIG. 11, the fluid introduced into the $(2-1)^{th}$ overlapping area 261a may move to the outlet 212 while repeatedly flowing to the $(2-2)^{th}$ overlapping area 261c through the second non-overlapping area 261b and flowing to another $(1-1)^{th}$ overlapping area from the $(2-2)^{th}$ overlapping area 261c.

Any one second hole 261", overlapping the overlapping area, among the plurality of second holes may be disposed closer to the inlet or outlet than still another second hole ''', overlapping the $(1-2)^{th}$ overlapping area, among the plurality of second holes. As an example, FIG. 9 illustrates a state in which any one second hole 261", overlapping the $(1-1)^{th}$ overlapping area, among the plurality of second holes, is disposed closer to the inlet 211 (see FIG. 8) than still another second hole 261''', overlapping the $(1-2)^{th}$ overlapping area, among the plurality of second holes.

Any one first hole 251", overlapping the $(2-1)^{th}$ overlapping area, among the plurality of first holes may be disposed closer to the inlet or outlet than still another first hole 251''', overlapping the $(2-2)^{th}$ overlapping area, among the plurality of first holes. As an example, FIG. 9 illustrates a state in which any one first hole 251", overlapping the $(2-1)^{th}$ overlapping area, among the plurality of first holes, is disposed closer to the outlet 212 than still another first hole 251''', overlapping the $(2-2)^{th}$ overlapping area, among the plurality of first holes.

For example, as illustrated in FIG. 9, when any one second hole 261", overlapping the $(1-1)^{th}$ overlapping area, among the plurality of second holes is disposed closer to the inlet 211 (see FIG. 8) than still another second hole 261''', overlapping the $(1-2)^{th}$ overlapping area, among the plurality of second holes, any one first hole 251", overlapping the $(2-1)^{th}$ overlapping area, among the plurality of first holes may be disposed closer to the outlet 212 than still another first hole 251''', overlapping the $(2-2)^{th}$ overlapping area, among the plurality of first holes.

Shapes of First Holes 251 and Second Holes 261

Each of the first holes 251 may be formed in one of a "V" shape open toward the outlet and a "V" shape open toward the inlet. As an example, FIG. 8 illustrates a state in which each of the first holes 251 has the "V" shape open toward the inlet 211. The first holes 251 may be consecutively arranged in the traveling direction D2 that is a direction from the inlet 211 to the outlet 212. For example, the first holes 251 may be formed in a herringbone pattern.

As illustrated in FIG. 9, the second holes 261 may overlap and communicate with at least two of the first holes 251. The second holes 261 may be formed in the other one of the "V" shape open toward the outlet and the "V" shape open toward the inlet. As an example, FIG. 8 illustrates a state in which each of the second holes 261 has the "V" shape open toward the outlet 212.

For example, when each of the first holes 251 is formed in the "V" shape open toward the outlet 212, each of the second holes 261 may be formed in the "V" shape open toward the inlet 211.

The second holes 261 may be consecutively arranged in the traveling direction D2 that is a direction from the inlet 211 to the outlet 212. For example, the second holes 261 may be formed in a herringbone pattern. The second holes 261 may have a shape corresponding to the first holes 251.

Here, the "V" shape is merely an example, and various modifications such as "U" shapes open to be opposite to each other and diagonal lines intersecting each other may be achieved as long as some of the first holes 251 and the second holes 261 may overlap each other when the first guide portion 250 and the second guide portion 260 are viewed in the stacking direction.

First Guide Portion Body 254 and Second Guide Portion Body 264

As illustrated in FIG. 8, the first guide portion 250 may further include a first guide portion body 254. The first hole 251 may be formed in the first guide portion body 254. The second guide portion 260 may further include a second guide portion body 264. The second hole 261 may be formed in the second guide portion body 264. At least portions of the first guide portion body 254 and the second guide portion body 264 may be joined by brazing.

Since a portion 270 overlapping the first guide portion body 254 and the second guide portion body 264 in the stacking direction D1 may be brazed, a brazed area may increase, and thus pressure resistance may increase. Further, since the portion 270 overlapping the first guide portion body 254 and the second guide portion body 264 in the stacking direction D1 may be brazed, a sufficient area to be brazed is secured, a separate area for joining is not required, and thus the heat exchanger unit 200 may be miniaturized.

The first guide portion 250 and the second guide portion 260 may be formed symmetrical to each other. A state in which two elements are symmetrical to each other may mean a state in which, when one of the two elements rotates about a predetermined axis formed in a perpendicular direction by 180 degrees, shapes of the two elements coincide with each other. As the first guide portion 250 and the second guide portion 260 are formed symmetrically with each other, one shape may be used as the first guide portion 250 and the second guide portion 260, and thus productivity may increase.

Embodiment 3

Figure 12:
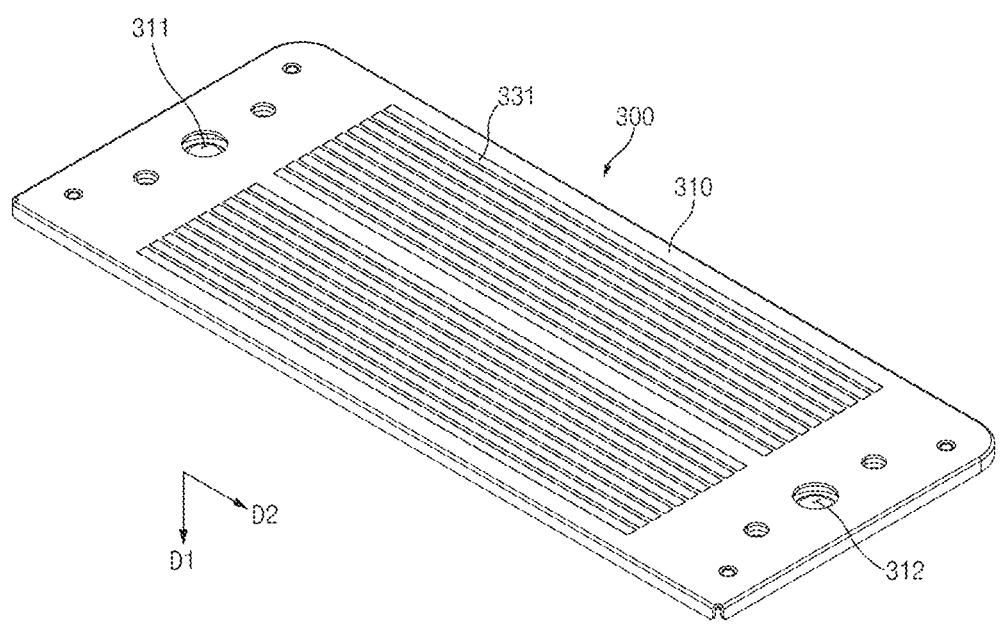
FIG. 12 is a view illustrating a heat exchanger unit of a heat exchanger assembly according to a third embodiment of the present invention.
Figure 13:
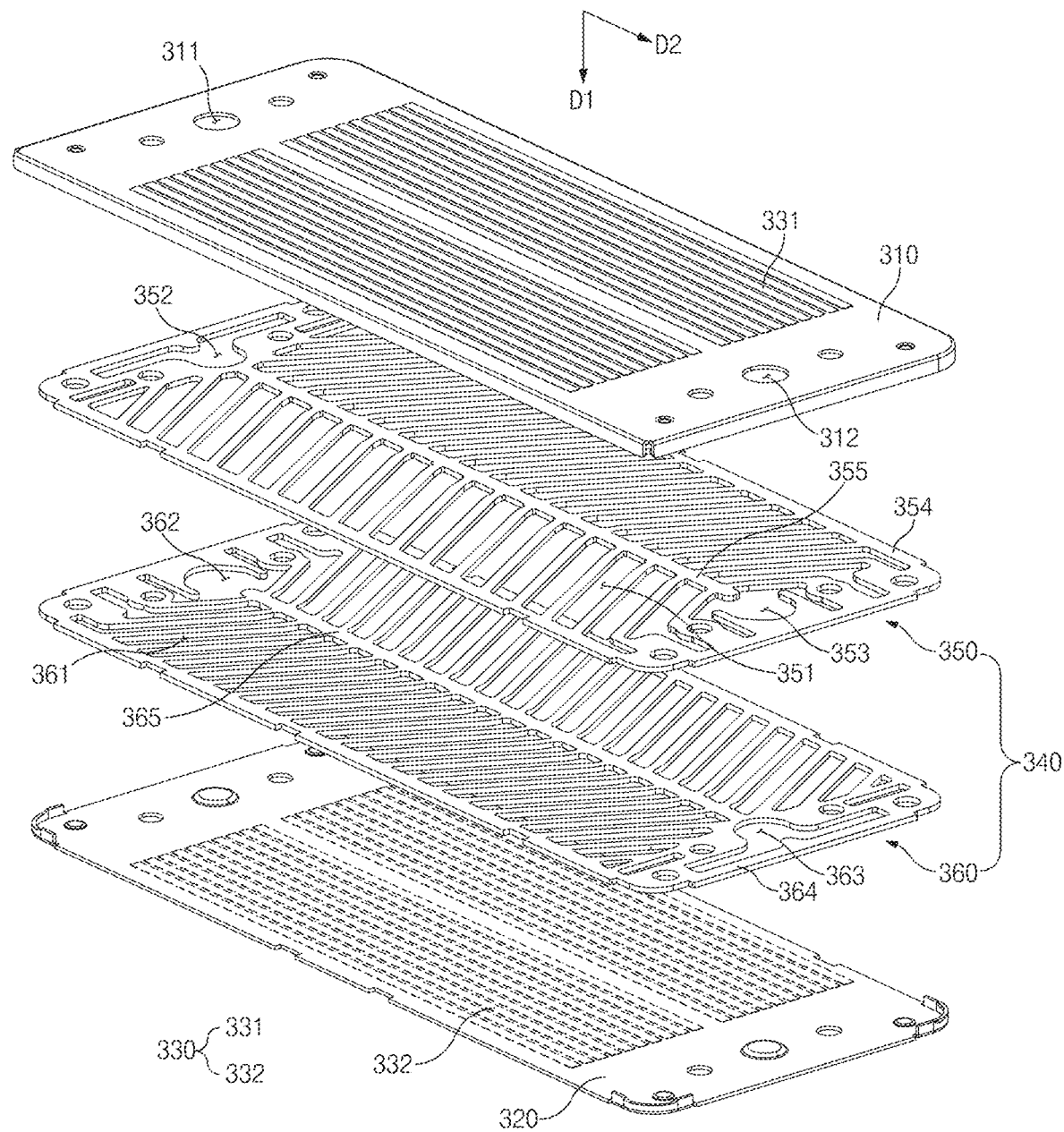
FIG. 13 is an exploded perspective view of FIG. 12.
Figure 14:
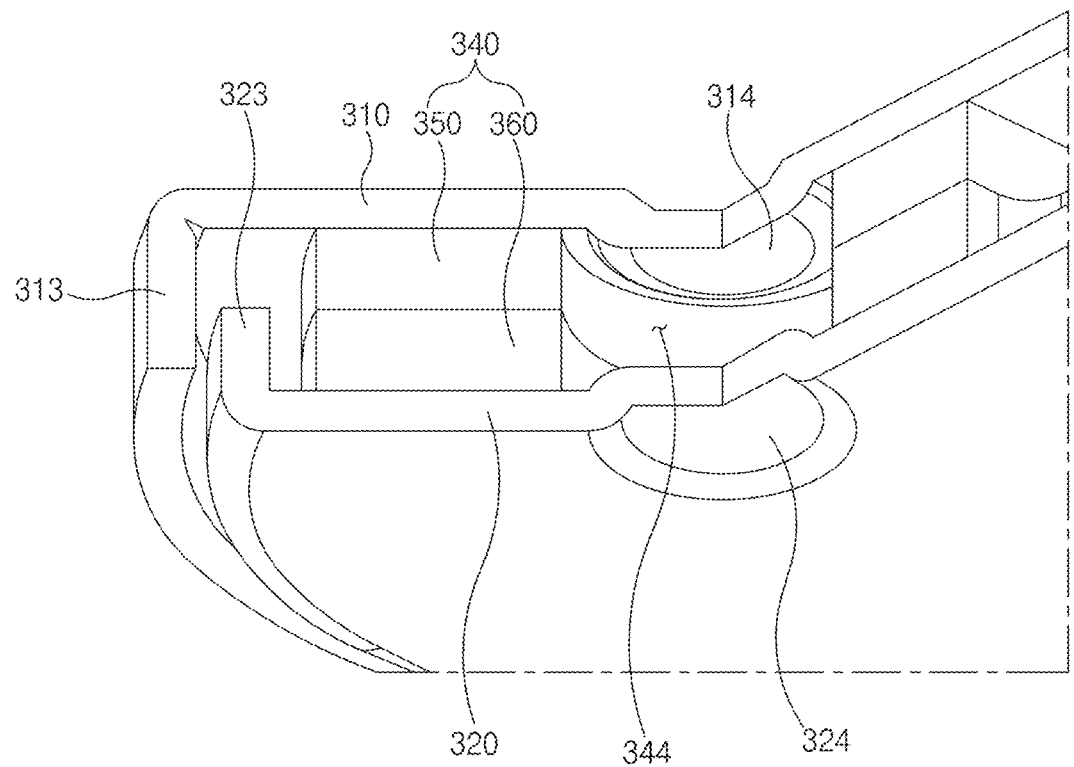
FIG. 14 is a cutaway perspective view of FIG. 12.
Figure 15:
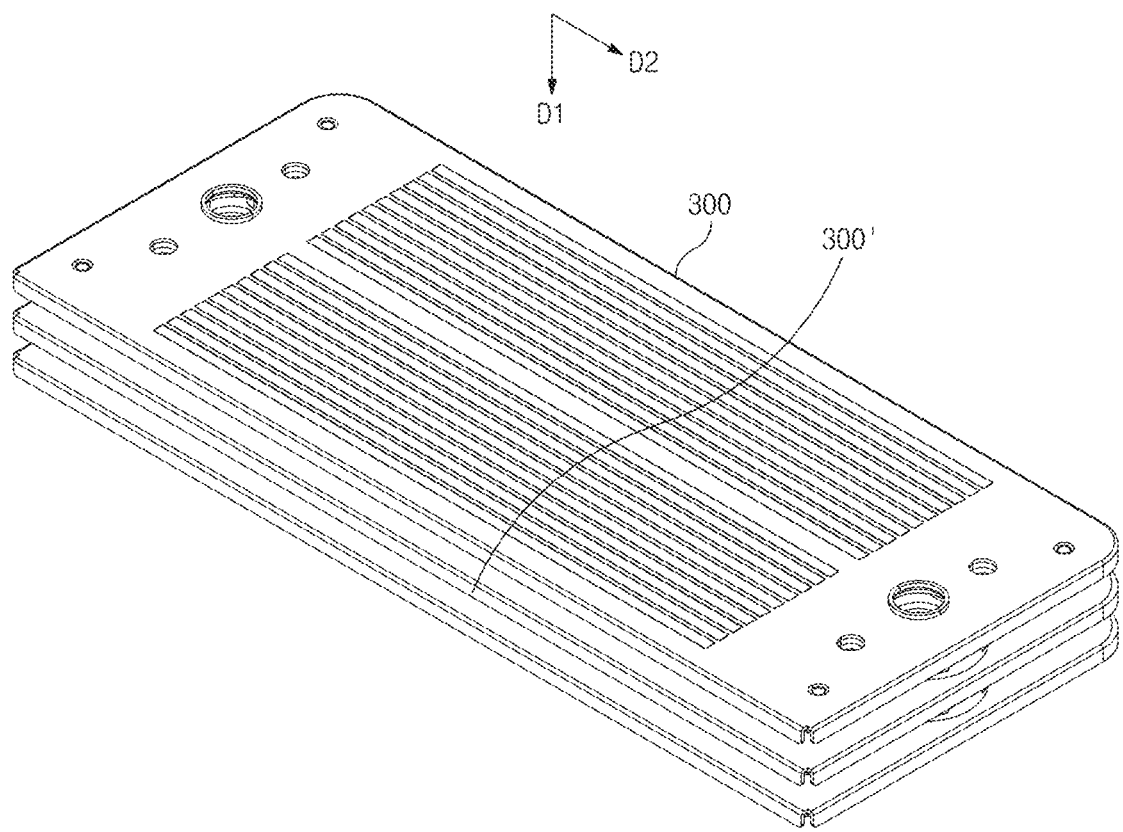
FIG. 15 is a perspective view illustrating a heat exchanger assembly according to the third embodiment of the present invention.
Figure 16:
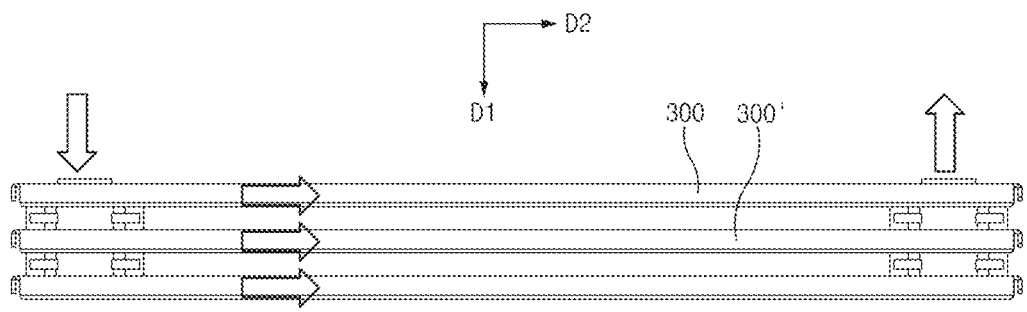
FIG. 16 is a view illustrating the heat exchanger assembly according to the third embodiment of the present invention when viewed in a different direction.

FIG. 12 is a view illustrating a heat exchanger unit of a heat exchanger assembly according to a third embodiment of the present invention. FIG. 13 is an exploded perspective view of FIG. 12. FIG. 14 is a cutaway perspective view of FIG. 12. FIG. 15 is a perspective view illustrating a heat exchanger assembly according to the third embodiment of the present invention. FIG. 16 is a view illustrating the heat exchanger assembly according to the third embodiment of the present invention when viewed in a different direction.

Hereinafter, the heat exchanger assembly according to the third embodiment of the present invention will be described with reference to FIGS. 12 to 16. The heat exchanger assembly according to the third embodiment differs from the heat exchanger assembly according to the second embodiment in that a first central area 355 and a second central area 365 are present. The same or equivalent components as those of the heat exchanger assembly according to the second embodiment are designated by the same or equivalent reference numerals or are omitted, and a detailed description thereof will be omitted.

First Central Area 355 and Second Central Area 365

As illustrated in FIG. 13, a first guide portion body 354 of a heat exchanger unit 300 (see FIG. 12) may include the first central area 355. The first central area 355 may extend in the traveling direction D2 and may be provided to partition a first hole 351. Further, a second guide portion body 364 may include the second central area 365. The second central area 365 may extend in the traveling direction D2 and may be provided to partition a second hole 361. The second central area 365 may be positioned to correspond to the first central area 355 and may be in surface contact with the first central area 355. For example, the first central area 355 and the second central area 365 may be joined to each other by brazing.

In the heat exchanger assembly according to the third embodiment of the present invention, since the first central area 355 and the second central area 365 may be joined to each other by brazing, pressure resistance performance may be further secured as compared to the heat exchanger assembly according to the second embodiment of the present invention.

As illustrated in FIGS. 12 and 13, a first heating member 331 and a second heating member 332 may be arranged so as not to overlap the first central area 355. A state in which there is no overlapping area may mean a state in which there is no overlapping area when viewed in the stacking direction D1. The first central area 355 and the second central area 365 are in contact with each other, water does not flow to the contact area, and thus the first heating member 331 and the second heating member 332 may be arranged so as not to overlap the first central area 355.

As in the second embodiment, when the first and second central areas 355 and 365 are not formed, there is a concern of overheating caused by imbalance of a flow rate in a central portion. In the third embodiment, the concern of the overheating may be eliminated by avoiding the first heating member 331 and the second heating member 332 from the central portion. Furthermore, in the case of the third embodiment, the first and second central areas 355 and 365 may be formed to secure even the pressure resistance performance.

End Portion 313 of First Plate and End Portion 323 of Second Plate

As illustrated in FIG. 14, an end portion 313 of a first plate 310 may protrude toward a second plate 320. In this case, an end portion 323 of the second plate 320 may protrude toward the first plate 310 and may be disposed inside or outside the end portion 313 of the first plate 310. FIG. 14 illustrates a state in which the end portion 323 of the second plate 320 is disposed inside the end portion 313 of the first plate 310.

A protrusion length of the end portion of the plate disposed on an inner side among the first plate 310 and the second plate 320 may be formed shorter than a length between the first plate 310 and the second plate 320. For example, as illustrated in FIG. 14, the end portion 323 of the second plate 320 disposed on the inner side may be accommodated in a space formed by the end portion 313 of the first plate 310 disposed on an outer side. As the end portion 323 of the second plate 320 disposed on the inner side may be accommodated in a space formed by the end portion 313 of the first plate 310 disposed on the outer side, a tolerance that may occur during assembling may be accommodated. Thus, a problem of a gap caused by the tolerance that may occur during assembling may be solved.

In this case, as illustrated in FIGS. 13 and 14, a first guide portion 330 and a second guide portion 340 have rounded corners so that the first guide portion 330 and the second guide portion 340 may be arranged in a space formed by the first plate 310 and the second plate 320. However, a state in which the corners are rounded is merely an example, and various shapes may be processed as long as the first guide portion 330 and the second guide portion 340 may be arranged in the space formed by the first plate 310 and the second plate 320.

Meanwhile, the end portion 313 of the first plate 310 may extend along a circumference of the first plate 310 and protrude toward the second plate 320. As the end portion 313 of the first plate 310 extends along the circumference of the first plate 310 and protrudes toward the second plate 320, the end portion 313 of the first plate 310 serves as a side wall, and thus rigidity of the first plate 310 may be improved. Further, distortion of the first plate 310 is prevented, and thus flatness of the first plate 310 may be secured.

First Protrusion Member 314, Second Protrusion Member 324, and Fixing Hole 344

Further, as illustrated in FIG. 14, the first plate 310 may include a first protrusion member 314 protruding toward the second plate 320. The second plate 320 may include a second protrusion member 324 protruding toward the first plate 310 and positioned at a position corresponding to the first protrusion member 314.

A guide part 340 may include a fixing hole 344. The fixing hole 344 may be formed to correspond to the positions of the first protrusion member 314 and the second protrusion member 324, and the first protrusion member 314 and the second protrusion member 324 may be inserted into the fixing hole 344. The first protrusion member 314, the second protrusion member 324, and the fixing hole 344 may serve as a guide that may guide the first plate 310, the second plate 320, and the guide part 340 such that the first plate 310, the second plate 320, and the guide part 340 may be coupled to accurate positions.

Meanwhile, as illustrated in FIG. 13, a first inlet 352 may have a shape extending in a direction opposite to the traveling direction D2, and a first outlet 353 may have a shape extending in the traveling direction D2. Further, a second inlet 362 may have a shape extending in the direction opposite to the traveling direction D2, and a second outlet 363 may have a shape extending in the traveling direction D2.

As the first inlet 352 and the second inlet 362 have the shape extending in the direction opposite to the traveling direction D2, a space in which water introduced through the first inlet 352 and the second inlet 362 moves in the direction opposite to the traveling direction D2 and thus the water may be accommodated may be formed. Thus, a reverse flow that may occur because the first inlet 352 and the second inlet 362 have small diameters may be prevented.

The first inlet 352 may have a shape symmetrical to the second outlet 363, and the first outlet 353 may have a shape symmetrical to the second inlet 362. Due to this shape, the shapes of the first plate 310 and the second plate 320 correspond to each other, so that productivity may increase.

Meanwhile, as illustrated in FIGS. 15 and 16, the heat exchanger assembly according to the third embodiment of the present invention may be formed by stacking a plurality of heat exchanger units 300 and 300'. In this case, the water may flow in parallel through the plurality of heat exchanger units 300 and 300'.

Water Heater

Figure 17:
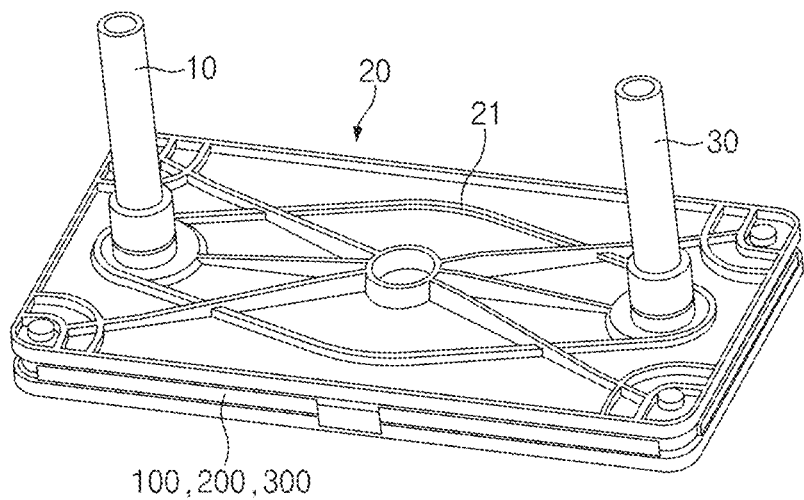
FIG. 17 is a view illustrating a water heater including the heat exchanger according to the first embodiment, the second embodiment, and the third embodiment of the present invention.

FIG. 17 is a view illustratively illustrating a water heater including the heat exchanger assembly according to the second embodiment of the present invention. Hereinafter, a water heater including any one of the heat exchanger assemblies according to the first embodiment, the second embodiment, and the third embodiment will be described. For understanding, FIGS. 1 to 16 may be referenced. However, as an example, FIG. 17 illustratively illustrates the water heater including the heat exchanger assembly according to the second embodiment, and the water heater including the heat exchanger assembly according to the first embodiment or the third embodiment may be also included in the scope of the present invention.

The water heater may include a direct water pipe 10, a heat exchanger assembly 20, and a hot water pipe 30. Direct water may be supplied through the direct water pipe 10. The heat exchanger assembly 20 may be connected to the direct water pipe 10 to heat the supplied direct water through heat exchange so as to generate hot water. The heat exchanger assembly 20 may be the heat exchanger assembly according to the first embodiment, the second embodiment, or the third embodiment of the present invention. The hot water pipe 30 may be connected to the heat exchanger assembly 20, and the hot water generated by the heat exchanger assembly 20 may be introduced into the hot water pipe 30.

The heat exchanger assembly 20 may include an assembly plate portion 21. The assembly plate portion 21 may be assembled to both surfaces of the heat exchanger units 100, 200, and 300 and connected to the direct water pipe 10 and the hot water pipe 30. Here, the shape of the assembly plate portion 21 is illustrative, the shape thereof is not limited as long as the assembly plate portion 21 may be connected to the direct water pipe 10 and the hot water pipe 30, and a separate structure for increasing the pressure resistance is not required. Further, the structure of the assembly plate portion 21 is not essential, and the direct water pipe 10 and the hot water pipe 30 may be directly connected to the heat exchanger assembly 20.

The heat exchanger assembly 20 may include the heat exchanger units 100, 200, and 300 having the inlets 111 and 211 communicating with the direct water pipe 10 and the outlets 112, 212, and 312 communicating with the hot water pipe 30.

The heat exchanger units 100, 200, and 300 may include the first plates 110, 210, and 310, the second plates 120, 220, and 320, the pairs of heating members 130, 230, and 330, and the guide parts 140, 240, and 340. The first plates 110, 210, and 310 and the second plates 120, 220, and 320 may define the internal space "S" through which the fluid introduced through the inlets 111, 211, and 311 flows toward the outlets 112, 212, and 312.

The pairs of heating members 130, 230, and 330 may be coupled to the first plates 110, 210, and 310 and the second plates 120, 220, and 320, respectively. The pairs of heating members 130, 230, and 330 may be electrically heated to provide heat to the internal space "S".

The guide parts 140, 240, and 340 may be arranged between the first plates 110, 210, and 310 and the second plates 120, 220, and 320. The guide parts 140, 240, and 340 may guide the fluid introduced through the inlets 111, 211, and 311 such that the fluid moves forward while alternately coming into contact with the first plates 110, 210, and 310 and the second plates 120, 220, and 320 in a process of flowing toward the outlets 112, 212, and 312.

The above description is merely illustrative of the technical spirit of the present invention, and those skilled in the art to which the present invention belongs may make various modifications and changes without departing from the essential features of the present invention. Thus, the embodiments disclosed in the present invention are not intended to limit the technology spirit of the present invention, but are intended to describe the present invention, and the scope of the technical spirit of the present invention is not limited by these embodiments. The scope of protection of the present invention should be interpreted by the appended claims, and all technical spirits within the scope equivalent thereto should be interpreted as being included in the scope of the present invention.

The invention claimed is:

1. A heat exchanger assembly comprising a heat exchanger unit having an inlet through which a fluid is introduced and an outlet through which the fluid is discharged,
    wherein the heat exchanger unit includes:
        a first plate;
        a second plate disposed on one surface of the first plate and defining, together with the first plate, an internal space through which the fluid introduced through the inlet flows to the outlet;
        a heating member coupled to at least one of the first plate and the second plate and configured to provide heat to the internal space; and
        a guide part disposed in the internal space and configured to guide the fluid introduced through the inlet toward a plate, to which the heating member is coupled, among the first plate and the second plate,
    wherein the heating member is a planar heating element,
    wherein the guide part includes:
        a plate-shaped first guide portion including a plurality of first holes; and
        a plate-shaped second guide portion including a plurality of second holes,
        wherein each of the first holes is formed in one of a "V" shape open toward the outlet and a "V" shape open toward the inlet,
        wherein each of the second holes is formed in the other one of the "V" shape open toward the outlet and the "V" shape open toward the inlet, and
        wherein the second holes overlap and communicate with at least two of the first holes.

2. The heat exchanger assembly of claim 1, wherein and the heating member includes:
    a first heating member coupled to the first plate; and
    a second heating member coupled to the second plate.

3. The heat exchanger assembly of claim 1, wherein the plate-shaped first guide portion disposed in surface contact with a surface, facing the second plate, among surfaces of the first plate and including a first hole configured to guide the fluid introduced through the inlet toward the second plate; and
    the plate-shaped second guide portion disposed in surface contact with a surface, facing the first plate, among surfaces of the second plate and includes the second hole configured to guide the fluid introduced from the first hole toward the first plate.

4. The heat exchanger assembly of claim 1, wherein the first plate, the plate-shaped first guide portion, the plate-shaped second guide portion, and the second plate are sequentially stacked in surface contact in a predetermined stacking direction,
    each of the plurality of first holes includes, with respect to the stacking direction, a $(1\text{-}1)^{th}$ overlapping area communicatively overlapping any one of the plurality of second holes, a first non-overlapping area communicating with the $(1\text{-}1)^{th}$ overlapping area and not overlapping the plurality of second holes, and a $(1\text{-}2)^{th}$ overlapping area communicating with the first non-overlapping area and communicatively overlapping another one of the plurality of second holes, and
    each of the plurality of second holes includes a $(2\text{-}1)^{th}$ overlapping area communicatively overlapping any one of the plurality of first holes, a second non-overlapping area communicating with the $(2\text{-}1)^{th}$ overlapping area and not overlapping the plurality of first holes, and a $(2\text{-}2)^{th}$ overlapping area communicating with the second non-overlapping area and communicatively overlapping another one of the plurality of first holes.

5. The heat exchanger assembly of claim 4, wherein the any one, overlapping the $(1\text{-}1)^{th}$ overlapping area, among the plurality of second holes is disposed closer to any one of the inlet and the outlet than the another one, overlapping the $(1\text{-}2)^{th}$ overlapping area, among the plurality of second holes, and
    the any one, overlapping the $(2\text{-}1)^{th}$ overlapping area, among the plurality of first holes is disposed closer to the other one of the inlet and the outlet than the another one, overlapping the $(2\text{-}2)^{th}$ overlapping area, among the plurality of first holes.

6. The heat exchanger assembly of claim 1, wherein
    the plate-shaped first guide portion is disposed in surface contact with a surface, facing the second plate, among surfaces of the first plate and including a plurality of holes configured to guide the fluid toward the second plate; and
    the plate-shaped second guide portion disposed in surface contact with a surface, facing the first plate, among surfaces of the second plate and including a plurality of second holes configured to guide the fluid toward the first plate,
    the first holes are arranged consecutively in a traveling direction that is a direction from the inlet to the outlet, and
    the second holes overlap and communicate with at least two of the first holes and are consecutively arranged in the traveling direction.

7. The heat exchanger assembly of claim 1, wherein:
    the plate-shaped first guide portion disposed in surface contact with a surface, facing the second plate, among surfaces of the first plate and including the plurality of first holes configured to guide the fluid toward the second plate, a first inlet communicating with the inlet, and a first outlet communicating with the outlet; and the plate-shaped second guide portion disposed in surface contact with a surface, facing the first plate, among surfaces of the second plate and includes the plurality of second holes configured to guide the fluid toward the first plate, a second inlet communicating with the first inlet, and a second outlet communicating with the first outlet.

* * * * *